United States Patent
Lin et al.

(10) Patent No.: US 7,344,998 B2
(45) Date of Patent: Mar. 18, 2008

(54) WAFER RECOVERING METHOD, WAFER, AND FABRICATION METHOD

(75) Inventors: Chun-Te Lin, Hsinchu (TW); Ta-Te Chen, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 68 days.

(21) Appl. No.: 10/943,081

(22) Filed: Sep. 15, 2004

(65) Prior Publication Data

US 2005/0258138 A1    Nov. 24, 2005

(30) Foreign Application Priority Data

May 21, 2004    (TW) ............................ 93114570 A

(51) Int. Cl.
*H01L 21/302* (2006.01)
*H01L 21/461* (2006.01)

(52) U.S. Cl. ..................... 438/745; 216/83; 216/95; 216/96; 216/100

(58) Field of Classification Search ............. 438/745, 438/751; 216/83, 95, 96, 100
See application file for complete search history.

(56) References Cited

U.S. PATENT DOCUMENTS 6,037,271 A * 3/2000 Carlson et al. ............ 438/751
6,461,978 B1 * 10/2002 Jo .............................. 438/754
2004/0108297 A1 * 6/2004 Erk et al. ...................... 216/2
2005/0227381 A1 * 10/2005 Cao et al. ..................... 438/14

OTHER PUBLICATIONS

S. Wolf and R.N. Tauber, (Silicon Processing for the VLSI Era, vol. 1- Process Technology, Lattice Press, 1986, pp. 535-536)□□.*

* cited by examiner

*Primary Examiner*—Binh X Tran
*Assistant Examiner*—Mahmoud Dahimene
(74) *Attorney, Agent, or Firm*—Townsend and Townsend and Crew LLP

(57) ABSTRACT

In order to use an etching solution of less complicated composition for recovering used wafers, embodiments of the present invention provide a recovering method, and also provide a kind of wafer, which is used as a process control wafer or dummy wafer, and fabrication methods. In one embodiment, a wafer-recovering method comprises providing a first wafer, wherein the first wafer has a base, a first conductive layer on the base, and a second conductive layer on the first conductive layer. The method further comprises removing the first and second conductive layers with an acidic solution to obtain a second wafer; and washing the second wafer with a liquid. The second conductive layer is formed on the first conductive layer in a deposition process, and the first conductive layer is more easily removed by the acidic solution than the second conductive layer.

38 Claims, 2 Drawing Sheets

WAFER RECOVERING METHOD, WAFER, AND FABRICATION METHOD

CROSS-REFERENCES TO RELATED APPLICATIONS

This application claims priority from R.O.C. Patent Application No. 093114570, filed May 21, 2004, the entire disclosure of which is incorporated herein by reference.

BACKGROUND OF THE INVENTION

This invention relates to a method for recovering a wafer and a wafer and its fabrication method, and more particularly to a method for recovering a control wafer/dummy wafer and a control wafer and a dummy wafer and their fabrication method.

In the semiconductor industry, in order to enhance the process quality, a control wafer (monitor wafer) is used for monitoring the process stability of equipments, such as the deposition rate or the number of particles. There is another kind of wafer called a "dummy wafer." A dummy wafer is used for maintaining the stability of a single-batch process. It is usually placed in a position where no product wafer or productive wafer is inside, so as to keep a field stable in reactors or to achieve other purposes for the process stability.

Because these kinds of nonproductive wafers are not used for manufacturing products, in general, manufacturers will recover the control wafer or the dummy wafer for reuse.

A control wafer is a bare wafer without deposits thereon before being used in a deposition process; however, the control wafer has a deposition layer on the silicon surface after used. The deposition layer is sometimes a pure substance or sometimes a compound (or a mixture).

Chemicals, such as etching solutions, are used for removing the deposition layer of a compound (or a mixture), whose components are more complicated. For example, the etching solution containing phosphoric acid, nitric acid and acetic acid is used for removing the AiSiCu alloy (see M. Sze ed., VLSI Technology, 2nd ed., 1988, McGraw-Hill Book Company, U.S.A., p. 398.); however, using this etching solution to recover control wafers and dummy wafers has the following disadvantage: a user must make a great effort to adjust the composition, the concentration and the temperature of the etching solution when the efficacy of removing the deposition layer is not so good.

Therefore, it is important to develop a new wafer-recovering method where, after a wafer is used as a control wafer or a dummy wafer, a less-component etching solution can be used to remove the deposition layer.

BRIEF SUMMARY OF THE INVENTION

In order to use an etching solution of less complicated composition for recovering used wafers, embodiments of the present invention provide a recovering method, and also provide a kind of wafer, which is used as a process control wafer or dummy wafer, and fabrication methods.

In order to remove a deposition layer on used control wafers or dummy wafers by a solution containing one kind of acid substance, the wafer is made by forming another deposition layer, which is easily soluble and has no influence on processes, on a wafer of no deposition layer. The meaning of "no influence on processes" is that it is achieved by using the wafer as a control wafer or dummy wafer to (1) monitor the process stability of equipments or (2) maintain the stability of a single-batch process.

Furthermore, during recovery of the used control wafers or dummy wafers having an upper layer and a lower layer, the upper layer is stripped from the wafer surface because an etching solution will remove the lower layer from the wafer edge or divots on the upper layer. The upper layer is a deposition layer made by the process, and the lower layer is the above-mentioned "another deposition layer".

In accordance with an aspect of the present invention, a wafer-recovering method comprises providing a first wafer, wherein the first wafer has a base, a first conductive layer on the base, and a second conductive layer on the first conductive layer. The method further comprises removing the first and second conductive layers with an acidic solution to obtain a second wafer; and washing the second wafer with a liquid. The second conductive layer is formed on the first conductive layer in a deposition process, and the first conductive layer is more easily removed by the acidic solution than the second conductive layer.

Another aspect of the invention is directed to a method for fabricating a nonproductive wafer, wherein the nonproductive wafer is used for improving the quality of depositing a deposition layer on a productive wafer. The method comprises providing a semiconductor base; and forming an conductive layer on the semiconductor base. The conductive layer is disposed between the semiconductor base and the deposition layer to be deposited on the nonproductive wafer. The conductive layer is more easily removed by an acidic solution than the deposition layer.

In accordance with another aspect of the present invention, a nonproductive wafer for improving the quality of depositing a deposition layer on a productive wafer comprises a silicon wafer; and a conductive layer disposed on the silicon wafer. The conductive layer is disposed between the semiconductor base and the deposition layer to be deposited on the nonproductive wafer. The conductive layer is more easily removed by an acidic solution than the deposition layer.

The advances of the present invention are as follows: (1) providing a novel wafer for monitoring or improving the process quality; (2) reducing the complexity of recovering used wafers; (3) increasing the wafer-recovering ratio; (4) any other benefits described below.

The present invention is illustrated through the detailed description and drawings in the embodiment section. The embodiments are described as an example and not for limiting the present invention. Moreover, the present invention is not limited by materials, process steps, process conditions, dimensions, and equipments illustrated in the embodiments.

DETAILED DESCRIPTION OF THE INVENTION

Figure 1A:
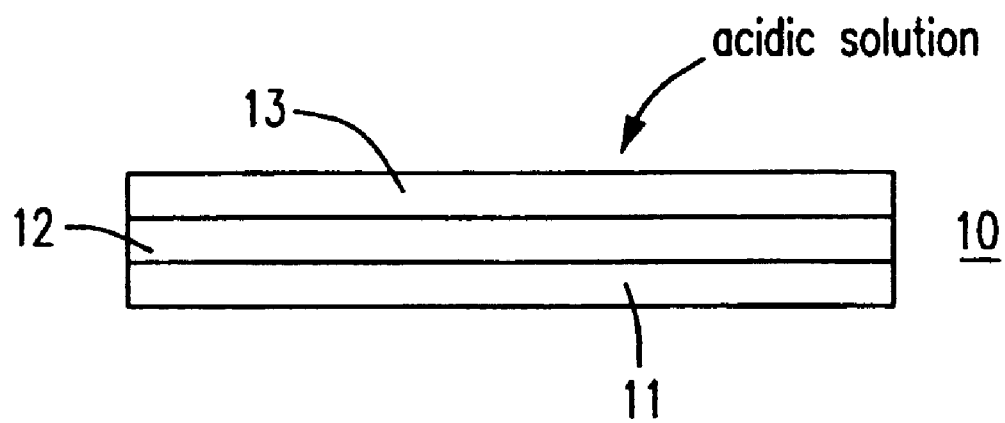
FIGS. 1(a) and (b) are schematic views showing the wafer-recovering method according to one embodiment of the present invention.
Figure 1B:
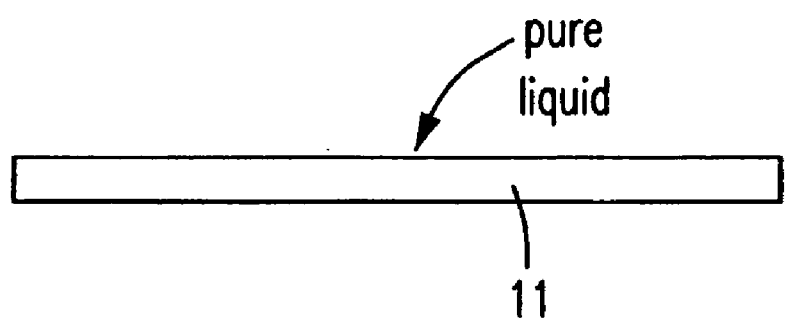

FIGS. 1(a) and 1(b) show the wafer-recovering method according to one embodiment of the present invention.

Referring to FIG. 1(a), a wafer 10 is provided. The wafer 10 has already been used for monitoring the stability of the process performed on an equipment or maintaining the stability of the single-batch process. In one embodiment, the wafer, before it is used, is a wafer of the present invention as described below.

The wafer 10 in FIG. 1(a) has, from the bottom to the top, a base 11, a first conductive layer 12, and a second conductive layer 13. The unused wafer initially includes the base 11 and the first conductive layer 12, and the existence of the second conductive layer 13 results from the process.

In one embodiment, the process which is desirably improved is a deposition process such as, for example, a metal deposition process. In another embodiment, the metal deposition process (for example, a physical vapor deposition or a chemical vapor deposition) may be the process for forming an aluminum alloy. Thus, in some embodiments, the second conductive layer 13 may comprise aluminum, silicon, copper, or an alloy of the three, for example, $AlSi_{1.0\%}Cu_{0.5\%}$, in which % means "percentage by weight."

In one embodiment, the base 11 of the wafer 10 may be a silicon substrate. In a specific embodiment, the first conductive layer 12 is titanium.

Then, as shown in FIG. 1(a), an acidic solution is applied, for example, a solution containing sulfuric acid. In some embodiments, the weight percentage of sulfuric acid is very high. The acidic solution is used for removing the conductive layer 12 and the conductive layer 13.

With respect to the step of using an acidic solution, in one embodiment, the equipment is SAT3081T produced by the American-based Semitool, Inc., the solution is 98% sulfuric acid (by weight), and the temperature is set at 80° C. It should be noted that the temperature or the concentration of the acidic solution are optional. For example, the solution temperature is in a range of about 65° C. to 95° C., and the sulfuric acid is at least about 90% by weight or pure. As for precise values, it depends on the process requirements including, for example, the properties of to-be-removed layers, operational time, the waste solution recovery, and so on. One skilled in the art can select appropriate values according to the specific requirement.

Referring to FIG. 1(b), after the first conductive layer 12 and the second conductive layer 13 are removed, the base 11 of the wafer 10 is washed by a pure liquid such as, for example, pure water. With respect to the washing step, in one embodiment, the equipment is a spin scrubber produced by the Korea-based DNS Korea Co., Ltd.

In order to implement the wafer-recovering method of the present invention, embodiments of the present invention further provide a wafer and its fabrication method. The wafer is used for improving the process quality of the above-mentioned deposition process of the second conductive layer.

Figure 2:
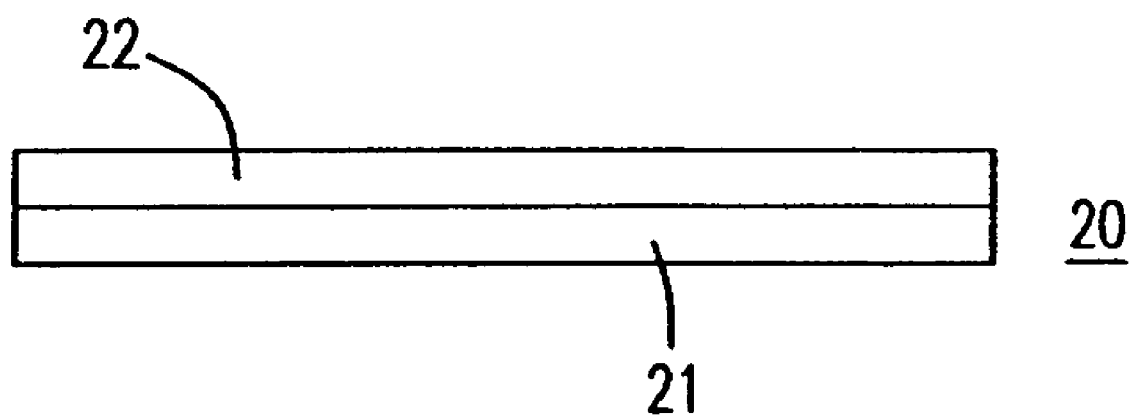
FIG. 2 is a schematic view showing the wafer and the method for fabricating the wafer according to one embodiment of the present invention.

As shown in FIG. 2, a semiconductor base 21 such as, for example, a silicon wafer is provided, and a first conductive layer 22 is formed on the semiconductor base 21 to form the structure of the wafer 20. The methods for forming the first conductive layer 22 include a physical vapor deposition such as, for example, sputtering or a chemical vapor deposition.

With respect to fabrication methods of wafers of the present invention, in one embodiment, the first conductive layer 22 is titanium. With respect to the formation of a titanium conductive layer, in some embodiments, a physical vapor deposition machine, ILC 10960, produced by Japan-based ANELVA CORPORATION, is used. In another embodiment, the deposition reaction occurs in a plasma environment containing Ar.

The thickness of the titanium conductive layer depends on the specifications of reuse of control wafers or dummy wafers after the wafer-recovering process. In one set of experiments, three wafers were used. The second conductive layer was $AlSi_{1.0\%}Cu_{0.5\%}$ and had a thickness of 30,000 angstroms. The first conductive layer was titanium, and the thicknesses of the three wafers were 300 angstroms, 600 angstroms, and 1000 angstroms, respectively. The three wafers were then treated with 98% sulfuric acid (by weight) in an etching machine, SAT3081T, produced by the American-based Semitool, Inc., at 80° C. for 10 minutes. Then, the surfaces of the three wafers were examined by the surface inspection tool, Surfscan 7700, produced by the American-based KLA-Tencor Corporation. It was found that the wafer having a titanium thickness of 300 angstroms had 1832 particles, the wafer having a titanium thickness of 600 angstroms had 54 particles, and the wafer having a titanium thickness of 1000 angstroms had 19 particles. Accordingly, the thickness of the first conductive layer can be selected by one skilled in the art depending on the quality requirements. For example, the thickness of the titanium layer can be 300 to 1000 angstroms.

Referring again to the wafer-recovering method of the present embodiment, the first conductive layer is more easily removed by an acidic solution such as, for example, sulfuric acid, than the second conductive layer. If there is only an aluminum alloy layer such as, for example, $AlSi_{1.0\%}Cu_{0.5\%}$ covering a silicon wafer, the aluminum alloy layer cannot be substantially removed by 98% sulfuric acid, and many particles remain on the surface of the wafer and will be found through a surface inspection tool. The particles may be silicon residues since in the microscope view aluminum and copper are removed more quickly, but the removal of silicon is almost nil.

In the etching machine, SAT3081T, produced by the American-based Semitool, Inc., a fixed amount of the solution is sprayed circularly onto the wafer surface. In some cases, at least 1000 control wafers or dummy wafers are recovered by applying 12 liters of 98% sulfuric acid in one day.

In one embodiment, the wafer 20 has a silicon substrate as a base and a stacked structure as a first conductive layer. The stacked structure is composed of a Ti layer and a TiN layer. The top layer is Ti while the bottom layer is TiN. Alternatively, the top layer is TiN while the bottom layer is Ti. Furthermore, the wafer can be recovered by the recovering method according to an embodiment of the present invention, and the Ti and TiN layers have to be removed by the acidic solution.

In the view of the wafer structure, the wafer as shown in FIG. 2 comprises a silicon substrate 21 and a conductive layer 22. After being used for improving the process quality of the deposition of the second conductive layer, the wafer 20 has a deposition layer deposited on the electrically conductive layer 22. It is further emphasized that the first conductive layer 22 is more easily removed by an acidic solution than the second conductive layer, so that the second conductive layer is removed along with the removal of the first conductive layer.

According to the present embodiment, the control wafer or the dummy wafer can be easily recovered by the wafer-recovering method, so that the wafer-recovery efficiency is increased and the cost of the semiconductor fabrication is lowered.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A wafer-recovering method, comprising:
providing a first wafer, wherein said first wafer has a base, a first conductive layer on said base, and a second conductive layer on said first conductive layer;
removing said first and second conductive layers with an acidic solution to obtain a second wafer; and
washing said second wafer with a liquid,
wherein said second conductive layer is formed on said first conductive layer in a deposition process, and said first conductive layer is more easily removed by said acidic solution than said second conductive layer, so that after said second conductive layer is removed along with said first conductive layer by said acidic solution, the base of the second wafer is characterized by a particulate contamination count, the particulate contamination count being lower than a predefined particulate contamination count.

2. The method according to claim 1, wherein said first wafer is used as a control wafer for said deposition process and said second conductive layer is a deposition layer from said deposition process.

3. The method according to claim 1, wherein said first wafer is used as a dummy wafer for said deposition process and said second conductive layer is a deposition layer from said deposition process.

4. The method according to claim 1, wherein said base is a silicon substrate.

5. The method according to claim 1, wherein said first conductive layer comprises titanium.

6. The method according to claim 1, wherein said second conductive layer comprises aluminum.

7. The method according to claim 6, wherein said second conductive layer comprises $AlSi_{1.0\%}Cu_{0.5\%}$.

8. The method according to claim 1, wherein said second conductive layer comprises copper.

9. The method according to claim 1, wherein said second conductive layer comprises silicon.

10. The method according to claim 1, wherein said acidic solution comprises a sulfuric acid.

11. The method according to claim 1, wherein said acidic solution is used at a temperature in a range from about 65° C. to about 95° C.

12. The method according to claim 1, wherein said first conductive layer comprises a titanium layer and a titanium nitride layer.

13. The method according to claim 1, wherein said liquid is pure water.

14. A method for fabricating a nonproductive wafer, wherein said nonproductive wafer is used for improving the quality of depositing a deposition layer on a productive wafer, said method comprising:
providing a semiconductor base; and
forming a conductive layer on said semiconductor base, said conductive layer to be disposed between said semiconductor base and said deposition layer to be deposited on said nonproductive wafer,
wherein said conductive layer is more easily removed by an acidic solution than said deposition layer, so that after said deposition layer is removed along with said conductive layer by said acidic solution, the semiconductor base is characterized by a particulate contamination count, the particulate contamination count being lower than a predefined particulate contamination count.

15. The method according to claim 14, wherein said conductive layer comprises titanium.

16. The method according to claim 14, wherein said conductive layer has a thickness in a range from about 300 angstroms to about 1000 angstroms.

17. The method according to claim 14, wherein said conductive layer is formed by physical vapor deposition.

18. The method according to claim 14, wherein said conductive layer is formed by chemical vapor deposition.

19. The method according to claim 14, wherein said conductive layer is formed by an evaporator.

20. The method according to claim 14, wherein said deposition layer comprises aluminum.

21. The method according to claim 20, wherein said deposition layer comprises $AlSi_{1.0\%}Cu_{0.5\%}$.

22. The method according to claim 14, wherein said acidic solution comprises a sulfuric acid.

23. The method of claim 1 wherein less than 100 particles of said first conductive layer and said second conductive layer remain on said second wafer after said conductive layers are removed with said acidic solution.

24. The method of claim 1 wherein less than 50 particles of said first conductive layer and said second conductive layer remain on said second wafer after said conductive layers are removed with said acidic solution.

25. A method for fabricating an integrated circuit, the method comprising:
providing a productive wafer;
processing the productive wafer;
providing a non-productive wafer, said non-productive wafer including a semiconductor base and a conductive layer formed overlying the semiconductor base;
simultaneously forming a first deposition layer overlying the productive wafer and a second deposition layer overlying the non-productive wafer, the non-productive wafer being used as a control wafer or a dummy wafer;
removing the conductive layer and the second deposition layer from the non-productive wafer using an acid, wherein said second deposition layer is removed along with said conductive layer by said acid, the semiconductor base is characterized by a particulate contamination count, and the particulate contamination count is lower than a pre-defined particulate contamination count; and
washing said semiconductor base with a liquid.

26. The method according to claim 25, wherein said conductive layer comprises titanium.

27. The method according to claim 25, wherein said conductive layer comprises a titanium layer and a titanium nitride layer.

28. The method according to claim 25, wherein said conductive layer has a thickness in a range from about 300 angstroms to about 1000 angstroms.

29. The method according to claim 25, wherein said conductive layer is formed by physical vapor deposition.

30. The method according to claim 25, wherein said conductive layer is formed by chemical vapor deposition.

31. The method according to claim 25, wherein said conductive layer is formed using an evaporator.

32. The method according to claim 25, wherein said second deposition layer comprises aluminum.

33. The method according to claim 25, wherein said second deposition layer comprises aluminum, silicon, and copper.

34. The method according to claim 25, wherein said second deposition layer comprises $AlSi_{1.0\%}Cu_{0.5\%}$.

35. The method according to claim 25, wherein said second deposition layer comprises copper.

36. The method according to claim 25, wherein said second deposition layer comprises silicon.

37. The method according to claim 25, wherein said acid comprises sulfuric acid.

38. The method according to claim 25, wherein said liquid is water.

* * * * *